(12) United States Patent
Miyata

(10) Patent No.: US 7,069,162 B2
(45) Date of Patent: Jun. 27, 2006

(54) MAGNETIC FIELD ANALYSIS METHOD AND PROGRAMS FOR ROTATING MACHINES

(75) Inventor: Kenji Miyata, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 14 days.

(21) Appl. No.: 10/761,405

(22) Filed: Jan. 22, 2004

(65) Prior Publication Data

US 2004/0210408 A1 Oct. 21, 2004

(30) Foreign Application Priority Data

Apr. 16, 2003 (JP) ............................. 2003-110968

(51) Int. Cl.
*G06F 19/00* (2006.01)
(52) U.S. Cl. ............................. 702/65; 703/13; 703/18
(58) Field of Classification Search ................. 702/57, 702/60, 64, 65; 707/3, 4, 2, 13, 18; 324/200, 324/629, 649, 76.11, 117 R; 318/490, 492
See application file for complete search history.

(56) References Cited

U.S. PATENT DOCUMENTS

| | | | | |
|---|---|---|---|---|
| 5,355,083 A * | 10/1994 | George et al. | ............... | 324/229 |
| 5,541,510 A * | 7/1996 | Danielson | ................... | 324/233 |
| 5,621,649 A * | 4/1997 | Iwata et al. | .................... | 702/64 |
| 6,198,181 B1 * | 3/2001 | Ali et al. | ....................... | 310/42 |
| 6,385,555 B1 * | 5/2002 | Hoffmann et al. | .......... | 702/145 |
| 6,434,491 B1 * | 8/2002 | Miyata et al. | ................ | 702/38 |
| 6,507,795 B1 * | 1/2003 | Namiki | ....................... | 702/66 |
| 6,662,125 B1 * | 12/2003 | Namiki | ........................ | 702/66 |
| 6,772,076 B1 * | 8/2004 | Yamamoto et al. | ........... | 702/65 |
| 2002/0099510 A1 * | 7/2002 | Namiki | ........................ | 702/66 |
| 2002/0183946 A1 * | 12/2002 | Miyata et al. | ................ | 702/65 |
| 2003/0204343 A1 * | 10/2003 | Yamamoto et al. | ........... | 702/65 |
| 2004/0017118 A1 * | 1/2004 | El-Ibiary | .................. | 310/68 B |
| 2004/0122613 A1 * | 6/2004 | Ide et al. | .................... | 702/115 |
| 2005/0055183 A1 * | 3/2005 | Tani et al. | ..................... | 703/2 |
| 2005/0067991 A1 * | 3/2005 | El-Ibiary | .................... | 318/490 |
| 2005/0071095 A1 * | 3/2005 | El-Ibiary | ..................... | 702/60 |

OTHER PUBLICATIONS

Preston, et al., "Induction Motor Analysis by Time-Stepping Techniques" IEEE Transactions on Magnetics, vol. 24, No. 1, Jan. 1988, pp. 471-474.

* cited by examiner

Primary Examiner—Patrick J. Assouad
(74) Attorney, Agent, or Firm—Dickstein Shapiro Morin & Oshinsky LLP

(57) ABSTRACT

Constant components and rotation fundamental mode components on the slide plane between a rotor and a stator are derived from a magnetic field distribution at a predetermined time. The analysis space is divided into a rotor space and a stator space. A fundamental mode on the slide plane is rotated by a rotation angle of a rotation magnetic field corresponding to a time-step width. A solution obtained in this state is added to the constant components. By using the addition result as the boundary conditions on the slide plane, non-linear magnetic field analysis is performed by taking into consideration the magnetic saturation in the stator space. The rotation fundamental mode on the slide mode is rotated by an angle obtained by subtracting the rotation angle of the rotor from the rotation angle of the rotation magnetic field corresponding to the time-step width.

19 Claims, 5 Drawing Sheets

MAGNETIC FIELD ANALYSIS METHOD AND PROGRAMS FOR ROTATING MACHINES

BACKGROUND OF THE INVENTION

1. Field of the Invention

The present invention relates to a method of analyzing the magnetic field of a rotating machine.

2. Description of the Related Art

As described, for example, in a paper "Induction motor analysis by time-stepping techniques", T. W. Preston, A. B. J. Reece and P. S. Sangha, IEEE Trans. on Magnetics, vol. 24, No. 1, pp. 471–474, 1988, a conventional rotating machine magnetic field analysis method adopts a time-stepping method of sequentially analyzing the magnetic field of a rotating machine by stepwise rotating the rotor.

In analyzing the magnetic field of a rotating machine, the rotor is stepwise rotated and a matrix equation having potentials as unknown variables is solved by a numerical solution approach such as a finite element method, generally by using an iterative solution method., Since a rotating machine is accompanied by a magnetic saturation phenomenon, a permeability changes as the function of a magnetic flux density so that iterative calculations are required which are inherent to non-linear analysis. With the above-cited rotating machine magnetic field analysis method, each time the rotor is stepwise rotated, a solution is calculated by the iterative solution method by using the solution obtained at the preceding time-step as an initial value of an unknown variable. In obtaining a solution with this method, however, it is necessary to suppress a rotation angle width narrow to some extent. This method becomes ineffective when the rotation angle width exceeds a certain value. To avoid this, the calculation is generally made by setting the initial value to 0. This requires, however, a large number of iterations necessary for obtaining a solution, taking a large calculation time.

SUMMARY OF THE INVENTION

An object of this invention is to provide a rotating machine magnetic field analysis method and its program capable of shortening a calculation time.

According to one feature of a rotating machine magnetic field analysis method of this invention, a magnetic field distribution in the whole analysis space is obtained by using, as initial values, a value of a magnetic field distribution in the stator space and a value of the magnetic field distribution in the rotor space.

Other features of the invention are given as stated in the appended claims.

Other objects, features and advantages of the invention will become apparent from the following description of the embodiments of the invention taken in conjunction with the accompanying drawings.

DESCRIPTION OF THE EMBODIMENTS

Embodiments of a magnetic field analyzing method of this invention will be described with reference to the accompanying drawings.

Figure 1:
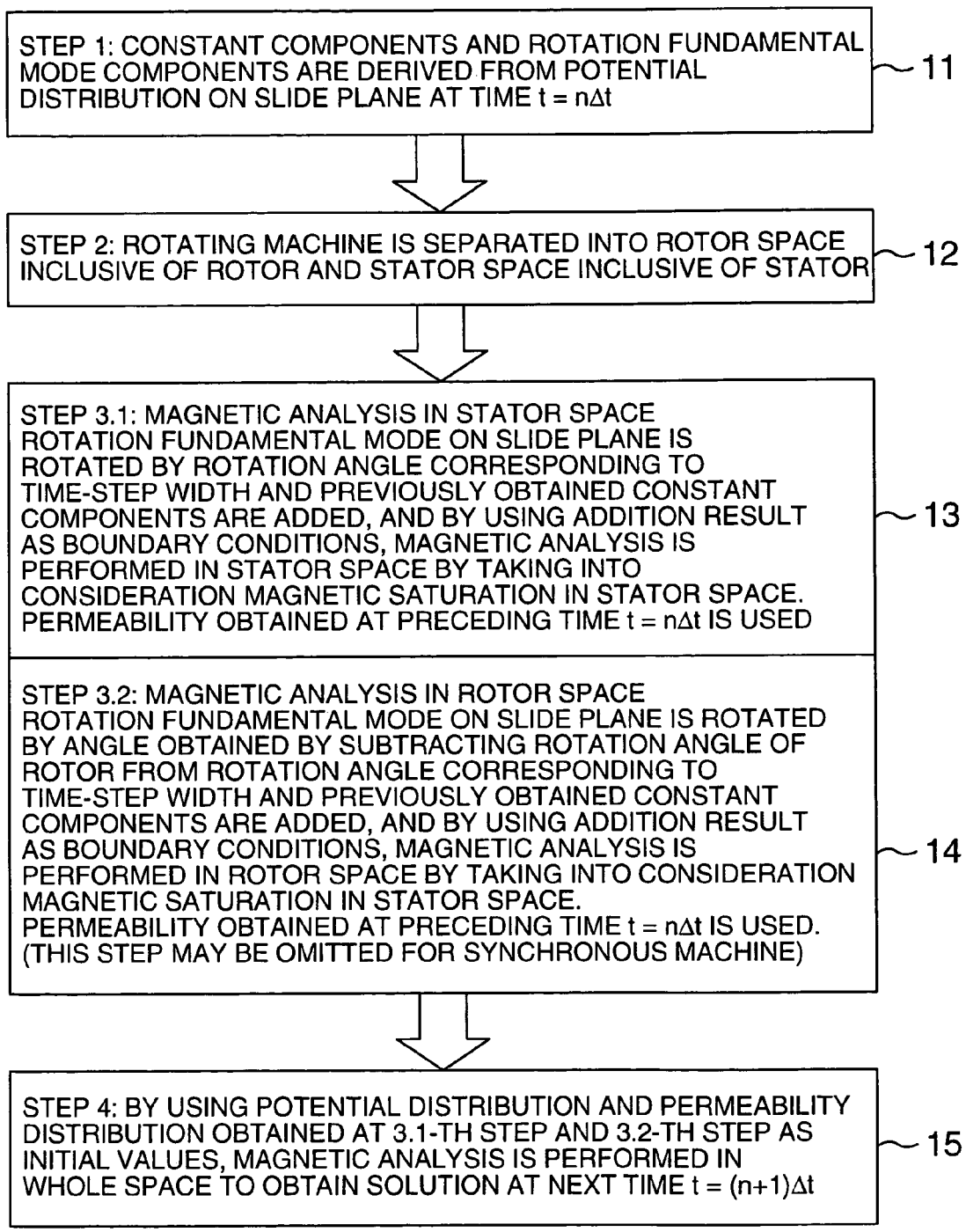
FIG. 1 is a diagram showing an example of a flow illustrating a rotating machine magnetic field analysis method according to the first embodiment of the invention.

FIG. 1 illustrates an example of a flow of a magnetic field analysis method according to a first embodiment of the invention. Since a magnetic field distribution is analyzed generally by utilizing a potential, the embodiments will be described also by utilizing a potential.

At the first step 11, a potential on a slide plane between the rotor and stator is calculated from a potential distribution at a predetermined time, e.g., n-th time $t=n\Delta t$ where $\Delta t$ is a time-step width. This solution is separated into each mode along a rotation direction to derive constant components and rotation fundamental mode components.

Figure 2:
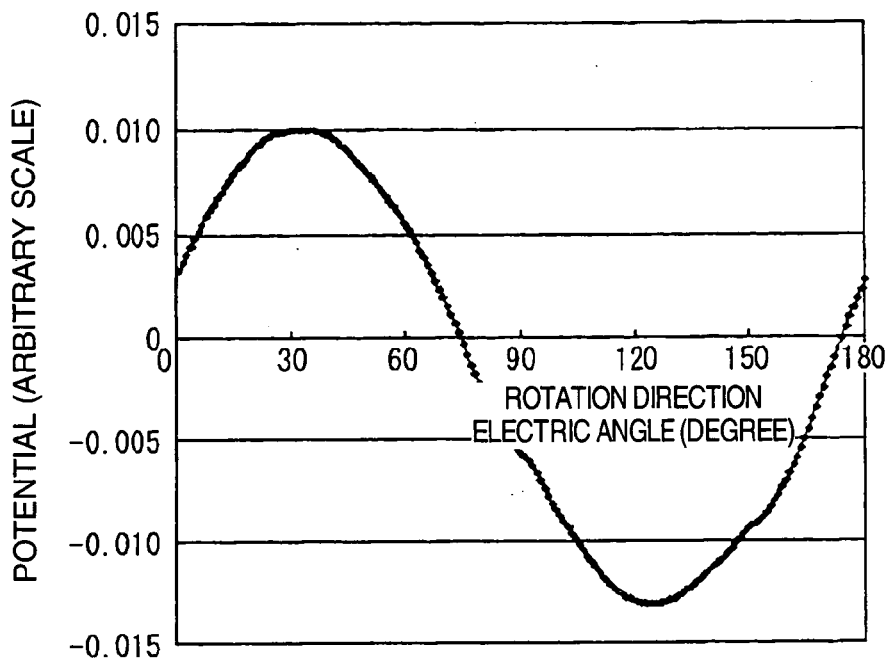
FIG. 2 is a diagram showing an example of a potential distribution on a slide plane.
Figure 3:
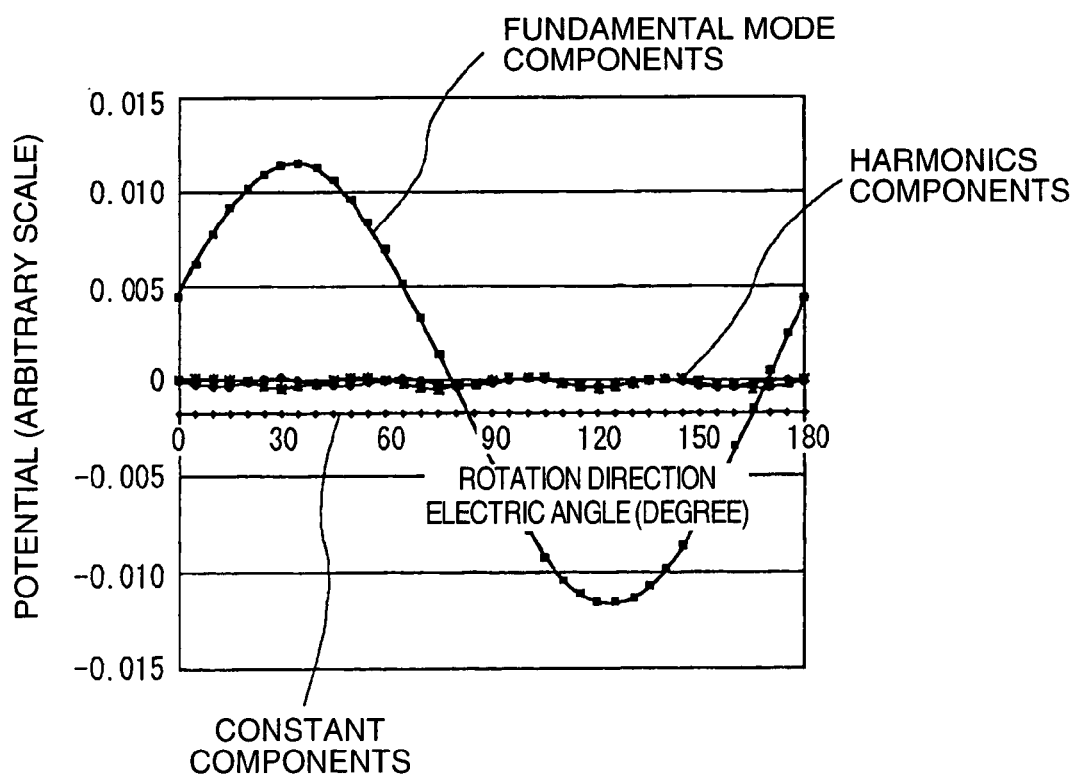
FIG. 3 is a diagram showing a potential distribution on a slide plane of components separated into each mode.

FIG. 2 shows an example of a potential distribution on the slide plane, and FIG. 3 is a graph showing the potential distribution separated into each mode. As shown in FIG. 3, the potential solution on the slide plane can be resolved into constant components, rotation fundamental mode components and harmonics components. As shown in FIG. 3, the constant components and rotation fundamental mode components are a main part of the potential components describing the rotation magnetic field.

At the second step 12, an analysis space is separated into a rotor space inclusive of the rotor and a stator space inclusive of the stator.

The third step is divided into two steps, a 3.1-th step 13 and a 3.2-th step 14, either one of which may be executed first. At the 3.1-th step 13 a fundamental mode on the slide plane is rotated by a rotation angle of a rotation magnetic field corresponding to a time-step width and the constant components are added to the rotated fundamental mode components. This addition result is used as the boundary conditions to perform a non-linear magnetic field analysis by taking into consideration the magnetic saturation in the stator space. In this case, the solution obtained at the preceding time $t=n\Delta t$ is used as the initial value of a permeability distribution.

At the 3.2-th step 14, the rotation fundamental mode on the slide plane is rotated by an angle obtained by subtracting a rotation angle of the rotor from the rotation angle of the rotation magnetic field corresponding to the time-step width and the constant components are added to the rotated fundamental mode components. This addition result is used as the boundary conditions to perform a magnetic field analysis by taking into consideration the magnetic saturation in the rotor space. Also in this case, the solution obtained at the preceding time $t=n\Delta t$ is used as the initial value of a permeability distribution. In a synchronous machine, the rotation speed of a rotation magnetic field is equal to the rotation speed of the rotor. Therefore, the boundary field on the slide plane changes only finely because of the influence of-harmonics components so that the 3.2-th step 14 may be omitted.

At the 3.1-th step 13 and 3.2-th step 14, the solution at the preceding time $t=n\Delta t$ may be used as the initial value of an unknown variable or another initial value such as 0 may also be used. One example of the unknown variable is a magnetic vector potential A defined as B=rot A. In the finite element method, a projected integer value aj of A upon a mesh side is an unknown numerical value in terms of numerical analysis. The potential A can be expressed by $A=\Sigma ajNj$ (Nj is a vector base function).

At the fourth step 15, by using as the initial values the potential solutions obtained at the 3.1-th step 13 and 3.2-th step 14, a magnetic field analysis is again performed in the whole space by taking the magnetic saturation into consideration.

In the non-linear magnetic analysis taking the magnetic saturation into consideration, the nearer the initial value of the potential is to the solution, the smaller the number of iterations for the iterative solution is and the shorter the calculation time is. In a synchronous machine among others, the 3.2-th step 14 can be omitted so that the calculation of obtaining the initial value near to the solution is only the analysis at the 3.1-th step in the stator space so that a suitable initial value can be obtained with a smaller scale of calculations.

Figure 4:
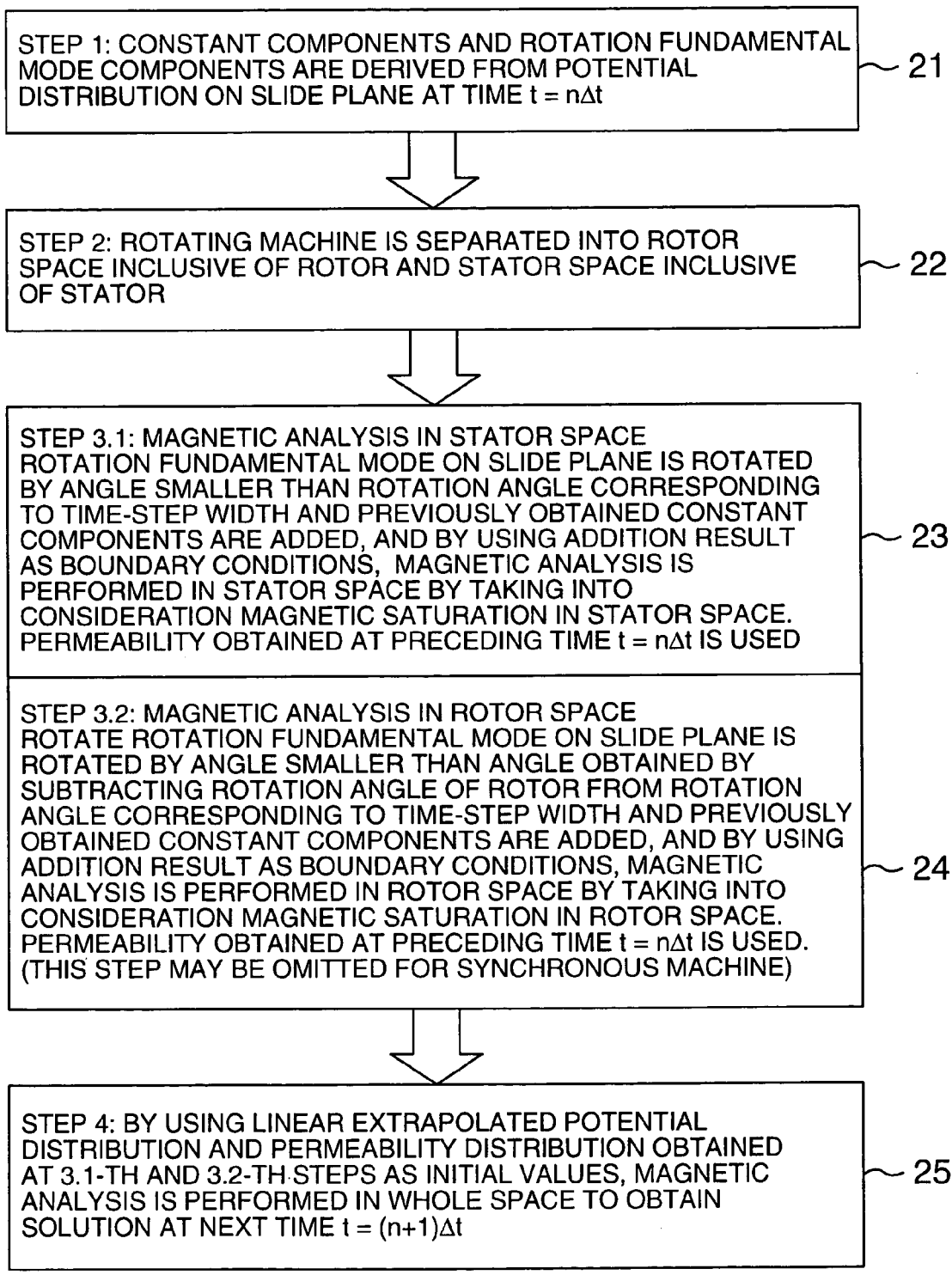
FIG. 4 is a diagram showing an example of a flow illustrating a rotating machine magnetic field analysis method according to the second embodiment of the invention.

FIG. 4 illustrates an example of a flow of a magnetic field analysis method according to a second embodiment of the invention. The second embodiment will also be described by utilizing a potential.

At the first step 11, a potential on the slide plane between the rotor and stator is calculated from a potential distribution at an n-th time $t=n\Delta t$ where $\Delta t$ is a time-step width. From this potential on the slide plane between the rotor and the stator, constant components and rotation fundamental mode components are derived.

At the second step 12, the analysis space is separated into the rotor space inclusive of the rotor and the stator space inclusive of the stator.

The third step is divided into two steps, a 3.1-th step 13 and a 3.2-th step 14, either one of which may be executed first. At the 3.1-th step 13 a rotation fundamental mode on the slide plane is rotated by a small angle such as ½ or ⅓ the rotation angle of the rotation magnetic field corresponding to a time-step width. The rotated fundamental mode components added with the constant components are used as the boundary conditions on the slide plane to perform a non-linear magnetic field analysis by taking into consideration the magnetic saturation in the stator space. In this case, the solution obtained at the preceding time $t=n\Delta t$ is used as the initial value of a permeability distribution.

At the 3.2-th step 14, the rotation fundamental mode on the slide plane is rotated by a small angle such as ½ or ⅓ the angle obtained by subtracting a rotation angle of the rotor from the rotation angle of the rotation magnetic field corresponding to the time-step width. The rotated fundamental mode components added with the constant components are used as the boundary conditions on the slide plane to perform a magnetic field analysis by taking into consideration the magnetic saturation in the rotor space. Also in this case, the solution obtained at the preceding time $t=n\Delta t$ is used as the initial value of a permeability distribution. The 3.2-th step 14 may be omitted from the reason stated earlier.

At the 3.1-th step 13 and 3.2-th step 14, the solution at the preceding time $t=n\Delta t$ may be used as the initial value of an unknown variable or another initial value such as 0 may also be used. In order to obtain a solution in a short time, it is preferable to use the solution at the preceding time $t=n\Delta t$.

At the fourth step 15, from a change in the potential solutions and permeability distributions obtained at the 3.1-th step 13 and 3.2-th step 14, the potential analysis and permeability distribution at the time $t=(n+1)\Delta t$ can be estimated through linear extrapolation. By using this solution as the initial value, a magnetic analysis is again performed in the whole space by taking the magnetic saturation into consideration.

In the second embodiment, since the rotation angle of the fundamental mode is smaller than that of the first embodiment, a change amount of the solution and permeability distribution at the time $t=n\Delta t$ is small. Therefore, the calculation time at the 3.1-th step 13 and 3.2-th step 14 is relatively short. It is possible to obtain an approximate solution and approximate permeability distribution at the time $t=(n+1)\Delta t$ at a higher speed than that of the first embodiment.

In the embodiment, an approximate value at the time $t=(n+1)\Delta t$ is obtained through linear extrapolation based upon one analysis in the rotor and stator spaces. Instead, the approximate value at the time $t=(n+1)\Delta t$ may be obtained by analyzing the two cases in the rotor and stator spaces through two-dimensional function extrapolation when the fundamental mode is rotated by two different rotation angles smaller than the rotation angle width corresponding to the time-step width $\Delta t$. In this case, although the calculation amount is doubled, the approximate value becomes nearer to the correct solution so that the whole analysis at the time $t=(n+1)\Delta t$ can be obtained in a shorter calculation time.

Figure 8:
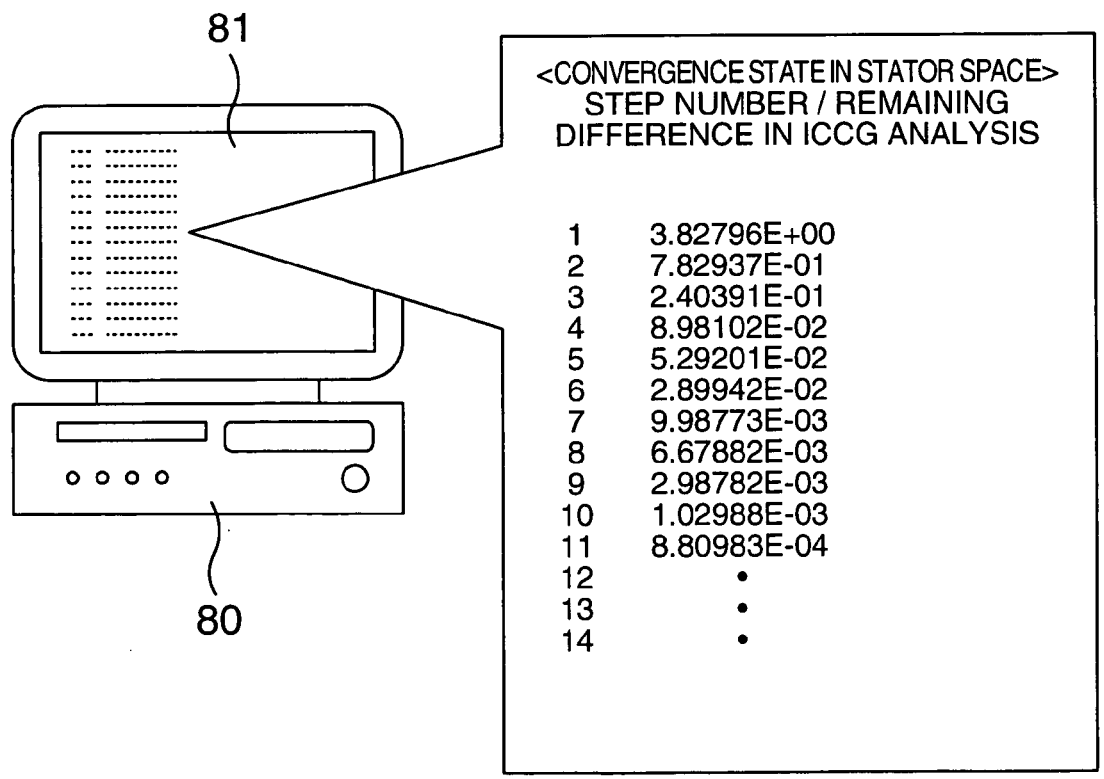
FIG. 8 is a diagram showing a typical example of displaying a convergence state of magnetic field analysis by the invention.

In the magnetic field analysis, a convergence solution of a large scale coarse matrix equation is generally obtained by an iterative solution method such as an ICCG method (a conjugate gradient method with incomplete Cholesky decomposition). Also in this embodiment, the solution is obtained by the iterative solution method. In both the embodiments, as shown in FIG. 8, the convergence state of calculations can be checked by calculating the equation with a computer 80 and displaying the calculation result on a display 81 connected to the computer 80. The display contents in FIG. 8 show a gradual change in remaining differences of the magnetic field analysis solutions in the stator space shown in FIGS. 1 and 4 obtained by the iterative solution method. The remaining difference is defined, for example, by $|Ax-b|/|b|$ for a matrix equation of $Ax=b$.

Although only the potential constant components and rotation fundamental mode components are used, the harmonics components may also be used in the similar manner. In this case, the approximate solution can be made more precise so that a solution by the whole space analysis can be obtained in a shorter calculation time.

According to the magnetic field analysis method for a rotation machine described above, the analysis is made by dividing the analysis space into the rotor and stator spaces so that an approximate solution can be obtained at high speed. Since the whole space analysis is made by using solutions nearer to the correct solution, the final solution can be effectively obtained faster than a conventional method. This effects become larger if the analysis system is large.

Figure 5:
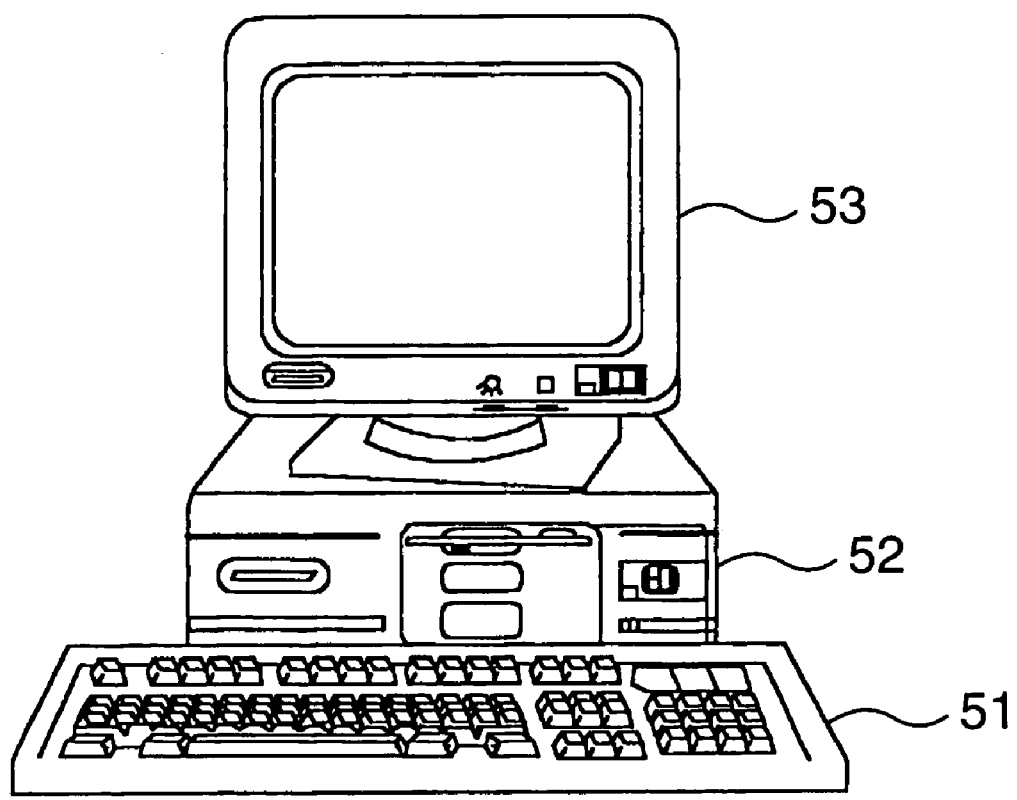
FIG. 5 is a diagram showing an example of a computer system.

The embodiments described above may be realized by a dedicated system. As illustratively shown in FIG. 5, the embodiments may be realized by a general computer system and a program running on this system, the computer system having: a keyboard 51; a computer 52 constituted of input means for inputting data described earlier and the program, a storage unit for storing the input data and program, a calculation unit and the like; and a display 53.

Figure 6:
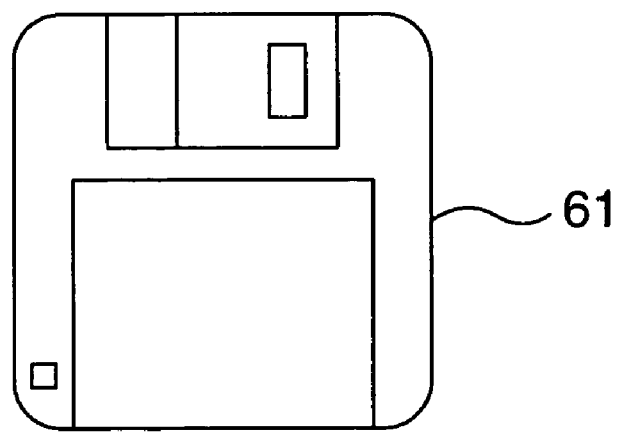
FIG. 6 is a diagram showing an example of a magnetic disk.
Figure 7:
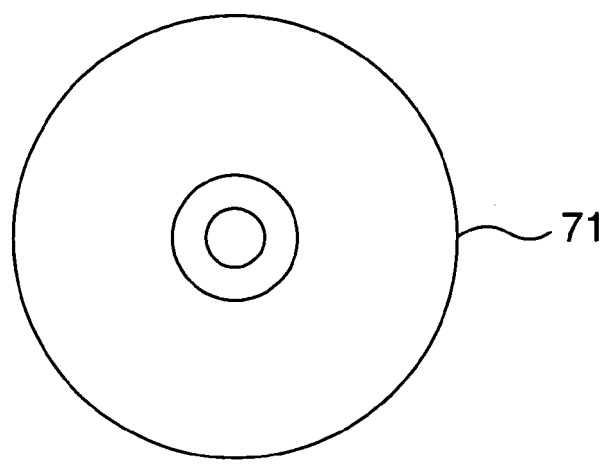
FIG. 7 is a diagram showing an example of a CD-ROM.

When the program is to be supplied to such a computer system, the program is stored in a storage medium such as a magnetic disk 61 such as shown in FIG. 6 and a CD-ROM 71 such as shown in FIG. 7. The storage medium distributed and kept is installed in the computer 52 to read the program with a magnetic disk drive or a CD-ROM drive of the computer 52. If the program distributed via a communication network is input to the input means, the program is stored in the storage medium such as a magnetic disk to allow repetitive use of the program.

According to the invention, it is possible to provide a magnetic field analysis method for a rotating machine and its program capable of shortening a calculation time.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A magnetic field analysis method for a rotating machine comprising:
   a first process of receiving, as initial values, a value of a magnetic field distribution in a stator space and a value of the magnetic field distribution in a rotor space;
   a second process of calculating the magnetic field distribution in a whole analysis space by using said initial values; and
   outputting the magnetic field distribution.

2. The magnetic field analysis method for a rotating machine according to claim 1, wherein said second process comprises:
   a process of deriving constant components and rotation fundamental mode components from the magnetic field distribution on a slide plane between a rotor and a stator obtained at a predetermined time;
   a process of separating the whole analysis space into the stator space and the rotor space;
   a process of rotating a rotation fundamental mode by a rotation angle of a rotation magnetic field corresponding to a time-step width and performing a magnetic field analysis in the stator space by using a rotation result added with the constant components as boundary conditions of the slide plane; and
   a process of rotating the rotation fundamental mode by an angle obtained by subtracting a rotation angle of the rotor corresponding to the time-step width from the rotation angle of the rotation magnetic field corresponding to the time-step width and performing a magnetic field analysis in the rotor space by using a rotation result added with the constant components as the boundary conditions of the slide plane.

3. The magnetic field analysis method for a rotating machine according to claim 1, wherein the magnetic field distribution is expressed by a physical quantity.

4. The magnetic field analysis method for a rotating machine according to claim 1, wherein the magnetic field analysis method comprises:
   a process of obtaining the magnetic field distribution through repetition of said first process and said second process;
   a process of calculating a remaining difference for each of the repetition; and
   a process of displaying the remaining difference.

5. The magnetic field analysis method for a rotating machine according to claim 1, further comprising a process of displaying the magnetic field distribution on a display screen.

6. The magnetic field analysis method for a rotating machine according to claim 2, further comprising:
   a process of deriving harmonics components from the magnetic field distribution on the slide plane between the rotor and the stator obtained at the predetermined time;
   a process of performing a magnetic field analysis in the stator space; and
   a process of performing a magnetic field analysis in the rotor space wherein said harmonic component is added to said rotation fundamental mode components.

7. A computer program stored on a computer readable storage medium for making a computer execute a magnetic field analysis method for a rotating machine comprising:
   a first process of receiving, as initial values, a value of a magnetic field distribution in a stator space and a value of the magnetic field distribution in a rotor space;
   a second process of calculating the magnetic field distribution in a whole analysis space by using said initial values; and
   outputting the magnetic field distribution.

8. A magnetic field analysis method for a rotating machine comprising:
   a process of deriving constant components and rotation fundamental mode components from a magnetic field distribution on a slide plane between a rotor and a stator obtained at a predetermined time;
   a process of separating a whole analysis space into a stator space and a rotor space;
   a process of rotating a rotation fundamental mode by a rotation angle of a rotation magnetic field corresponding to a time-step width and performing a magnetic field analysis in the stator space by using a rotation result added with the constant components as boundary conditions of the slide plane; and
   a process of performing a magnetic field analysis in the whole analysis space by using, as initial values, a magnetic field distribution obtained in the stator space and the magnetic field distribution in the rotor space already obtained at the predetermined time and obtaining a magnetic field distribution at a time lapsed by the time-step width from the predetermined time.

9. The magnetic field analysis method for a rotating machine according to claim 8, further comprising a process of deriving harmonics components from the magnetic field distribution on the slide plane between the rotor and the stator obtained at the predetermined time, wherein in said process of performing the magnetic field analysis in the stator space, the harmonics components are added to rotation fundamental mode components.

10. A magnetic field analysis method for a rotating machine comprising:
   a process of deriving constant components and rotation fundamental mode components from a magnetic field distribution on a slide plane between a rotor and a stator obtained at a predetermined time;
   a process of separating a whole analysis space into a stator space and a rotor space;
   a process of rotating a rotation fundamental mode by a rotation angle smaller than a rotation angle of a rotation magnetic field corresponding to a time-step width and performing a magnetic field analysis in the stator space by using a rotation result of the rotation fundamental mode added with the constant components as boundary conditions of the slide plane;

a process of rotating the rotation fundamental mode by a rotation angle smaller than an angle obtained by subtracting a rotation angle of the rotor from the rotation angle of the rotation magnetic field corresponding to the time-step and performing a magnetic field analysis in the rotor space by using a rotation result of the rotation fundamental mode added with the constant components as boundary conditions of the slide plane;

a process of obtaining a magnetic field distribution in the stator space and a magnetic field distribution in the rotor space, respectively at a time lapsed by the time-step width from the predetermined time, from the magnetic field distribution in the stator space and the magnetic field distribution in the rotor space; and a process of performing a magnetic field analysis in the whole analysis space by using, as initial values, the magnetic field distributions in the stator space and in the rotor space obtained at the time lapsed by the time-step width and obtaining a magnetic field distribution in the whole analysis space at the time lapsed by the time-step width from the predetermined time.

11. The magnetic field analysis method for a rotating machine according to claim 10, further comprising a process of deriving harmonics components from the magnetic field distribution on the slide plane between the rotor and the stator obtained at the predetermined time, wherein in said process of performing the magnetic field analysis in the stator space, the harmonics components are added to rotation fundamental mode components.

12. The magnetic field analysis method for a rotating machine according to claim 1, wherein said method is a computer implemented method.

13. The magnetic field analysis method for a rotating machine according to claim 8, wherein said method is a computer implemented method.

14. The magnetic field analysis method for a rotating machine according to claim 10, wherein said method is a computer implemented method.

15. The magnetic field analysis method for a rotating machine according to claim 7, wherein said second process comprises:

a process of deriving constant components and rotation fundamental mode components from the magnetic field distribution on a slide plane between a rotor and a stator obtained at a predetermined time;

a process of separating the whole analysis space into the stator space and the rotor space;

a process of rotating a rotation fundamental mode by a rotation angle of a rotation magnetic field corresponding to a time-step width and performing a magnetic field analysis in the stator space by using a rotation result added with the constant components as boundary conditions of the slide plane; and a process of rotating the rotation fundamental mode by an angle obtained by subtracting a rotation angle of the rotor corresponding to the time-step width from the rotation angle of the rotation magnetic field corresponding to the time-step width and performing a magnetic field analysis in the rotor space by using a rotation result added with the constant components as the boundary conditions of the slide plane.

16. The magnetic field analysis method for a rotating machine according to claim 7, wherein the magnetic field distribution is expressed by a physical quantity.

17. The magnetic field analysis method for a rotating machine according to claim 7, wherein the magnetic field analysis method comprises:

a process of obtaining the magnetic field distribution through repetition of said first process and said second process;

a process of calculating a remaining difference for each of the repetition; and a process of displaying the remaining difference.

18. The magnetic field analysis method for a rotating machine according to claim 7, further comprising a process of displaying the magnetic field distribution on a display screen.

19. The magnetic field analysis method for a rotating machine according to claim 7, further comprising:

a process of deriving harmonics components from the magnetic field distribution on the slide plane between the rotor and the stator obtained at the predetermined time;

a process of performing a magnetic field analysis in the stator space; and a process of performing a magnetic field analysis in the rotor space wherein said harmonic component is added to said rotation fundamental mode components.

* * * * *